(12) United States Patent
Zitlaw et al.

(10) Patent No.: US 9,524,247 B2
(45) Date of Patent: Dec. 20, 2016

(54) FRACTURED ERASE SYSTEM AND METHOD

(71) Applicant: Cypress Semiconductor Corporation, San Jose, CA (US)

(72) Inventors: Clifford A. Zitlaw, Sunnyvale, CA (US); Hagop Artin Nazarian, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/630,238

(22) Filed: Feb. 24, 2015

(65) Prior Publication Data

US 2015/0169463 A1    Jun. 18, 2015

Related U.S. Application Data

(62) Division of application No. 12/366,519, filed on Feb. 5, 2009, now Pat. No. 8,984,238.

(51) Int. Cl.
| | |
|---|---|
| G11C 16/00 | (2006.01) |
| G06F 12/08 | (2016.01) |
| G11C 16/10 | (2006.01) |
| G11C 16/16 | (2006.01) |
| G11C 16/34 | (2006.01) |
| G06F 12/02 | (2006.01) |

(52) U.S. Cl.
CPC ....... *G06F 12/0891* (2013.01); *G06F 12/0246* (2013.01); *G11C 16/10* (2013.01); *G11C 16/16* (2013.01); *G11C 16/3409* (2013.01); *G06F 2212/7205* (2013.01); *G06F 2212/7209* (2013.01)

(58) Field of Classification Search
CPC ..................................................... G11C 16/00
See application file for complete search history.

(56) References Cited

U.S. PATENT DOCUMENTS

| | | | | |
|---|---|---|---|---|
| 5,949,714 A | * | 9/1999 | Hemink ................ | G11C 16/12 365/185.17 |
| 5,963,476 A | * | 10/1999 | Hung .................. | G11C 16/0416 257/E27.103 |
| 7,457,167 B2 | | 11/2008 | Patrascu et al. | |
| 7,558,122 B2 | * | 7/2009 | Kim ...................... | G11C 16/16 365/185.23 |

(Continued)

OTHER PUBLICATIONS

USPTO Advisory Action for U.S. Appl. No. 12/366,519, dated Jul. 5, 2013; 2 pages.

(Continued)

*Primary Examiner* — Min Huang

(57) ABSTRACT

Efficient and convenient storage systems and methods are presented. In one embodiment, a fractured erase process is performed in which a pre-program process, erase process and soft program process are initiated independently. Memory cells can be pre-programmed and conditioned independent of an erase command. The initiation of the independent pre-programming is partitioned from an erase command which is partitioned from initiation of a soft-programming command. A cell is erased wherein the erasing includes erase operations that are partitioned from the pre-preprogramming process. In one embodiment, the independent pre-program process is run in the background.

20 Claims, 7 Drawing Sheets

(56) References Cited

U.S. PATENT DOCUMENTS

| | | | | |
|---|---|---|---|---|
| 7,668,019 | B2* | 2/2010 | Byeon | G11C 11/5635 |
| | | | | 365/185.03 |
| 8,984,238 | B2* | 3/2015 | Zitlaw | G11C 16/10 |
| | | | | 711/154 |
| 2005/0030828 | A1* | 2/2005 | Tanaka | G11C 16/10 |
| | | | | 365/232 |
| 2006/0156078 | A1* | 7/2006 | Baumhof | G06F 3/0619 |
| | | | | 714/100 |
| 2007/0147136 | A1* | 6/2007 | Yoon | G11C 16/16 |
| | | | | 365/185.29 |
| 2010/0259994 | A1* | 10/2010 | Terauchi | G11C 16/344 |
| | | | | 365/185.22 |

OTHER PUBLICATIONS

USPTO Advisory Action for U.S. Appl. No. 12/366,519, dated Oct. 1, 2014; 3 pages.

USPTO Final Rejection for U.S. Appl. No. 12/366,519, dated Apr. 30, 2013; 9 pages.

USPTO Final Rejection for U.S. Appl. No. 12/366,519, dated Jul. 22, 2014; 11 pages.

USPTO Final Rejection for U.S. Appl. No. 12/366,519, dated Aug. 22, 2012; 9 pages.

USPTO Final Rejection for U.S. Appl. No. 12/366,519, dated Oct. 28, 2013; 10 pages.

USPTO Non-Final Rejection for U.S. Appl. No. 12/366,519, dated Mar. 5, 2014; 10 pages.

USPTO Non-Final Rejection for U.S. Appl. No. 12/366,519, dated Mar. 27, 2012; 8 pages.

USPTO Non-Final Rejection for U.S. Appl. No. 12/366,519, dated Sep. 6, 2013; 8 pages.

USPTO Non-Final Rejection for U.S. Appl. No. 12/366,519, dated Nov. 9, 2011; 9 pages.

USPTO Notice of Allowance for U.S. Appl. No. 12/366,519, dated Nov. 4, 2014; 8 pages.

* cited by examiner

1000

1010

A host determines portions of memory associated with invalid data.

1020

A command to perform independent pre-programming is issued.

1030

An independent pre-programming operation is performed.

FIG 4

FRACTURED ERASE SYSTEM AND METHOD

RELATED APPLICATION

This applications is a divisional of and claims priority and benefit of application Ser. No. 12/366,519, entitled filed "A FRACTURED ERASE SYSTEM AND METHOD" filed on Feb. 5, 2009, which is incorporated herein by reference.

TECHNICAL FIELD

This invention relates generally to information storage systems and methods and more particularly, to systems and methods for altering information stored in a memory.

BACKGROUND OF THE INVENTION

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, the electronic systems designed to provide these results include memories. However, accessing memory resources in a fast and efficient manner can involve complicated protocols.

Numerous electronic devices include processors that operate by executing software comprising a series of instructions for manipulating data in the performance of useful tasks. The instructions and associated data are typically stored in a memory. Memories usually consist of a location for storing information and a unique indicator or address. The utility a device provides often depends upon the speed and efficiency at which instructions are executed. The ability to access a memory and transfer information quickly and conveniently usually has a significant impact on information processing latency.

Traditional attempts at memory control are often very convoluted and complex. Such protocols also suffer from inefficiency and overhead in regards to latency and available bandwidth throughout the system, which can result in issues with scheduling due to unknown traffic patterns and limited resources. Such latency problems can be experienced by a host attempting to read or write information to the memory. There are a number of applications (e.g., real time applications) where processing time is critical and extended latency in retrieving or writing information to a memory can have detrimental impacts on performance and user experience. For example, in real time applications extended latency can cause jumpy presentations.

Information is typically written by a program operation that programs or writes a memory cell. The information is typically altered by erasing the cell and rewriting. The erase operation forces voltages onto the erase block that cause the bits to change to a logical 1 state, regardless of whether a particular bit previously was a logical 0 or logical 1. An erase is performed on a number of block bits simultaneously and there is a tendency for a cell that was previously at a logical 1 (e.g., an erased state) to be erased harder than a cell that was at a logical 0 state (e.g., programmed). After an erasure it is preferred that the state of the cells in a block are uniformly erased regardless of whether the previous state was a logical 0 or a logical 1. This uniformity of erase states assures that the eventual program operation is likely to be more successful. Uniformity of erase states can impact device endurance, data retention and the ability to discern multiple bits from a single cell.

The granularity of program operations can be performed on a bit-wise, word-wise or page wise basis, however, similar programming granularity is not available during Erase operations where erasure (to the 1 state) is accomplished during a single simultaneous block operation. Conventional approaches to performing an erase on a simultaneous block level can exacerbate latency problems due to the time it takes to condition and erase an entire block. FIG. 1 is a flow chart of a conventional erase sequence. An indication to erase is received in operation 91 and a page pre-program process involving operation 92, 93, 94 and 95 is performed. The "actual erasing" of cells waits while the pre-program process loops multiple times through pre-program operation 93 of driving memory cells to a logical value opposite of a static state. When all the pre-programming is completed, then the "actual erasing" of cells (e.g. driving the cells to a static state, etc.) is begun in operation 96 followed by soft program operation 97, verify operation 98 and end 99.

SUMMARY OF THE INVENTION

Efficient and convenient storage systems and methods are presented. In one embodiment, a fractured erase process is performed in which a pre-program process, erase process and soft program process are initiated independently. Memory cells can be pre-programmed and conditioned independent of an erase command. The initiation of the independent pre-programming process is partitioned from initiation of erase command which is partitioned from initiation of a soft-programming command. A cell is erased wherein the erasing includes erase operations that are partitioned from the pre-preprogramming process. In one embodiment, the independent pre-program process is run in the background.

BRIEF DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 4 is a block diagram of an exemplary pre-programming process in accordance with one embodiment of the present invention.

DETAILED DESCRIPTION

Figure 1:
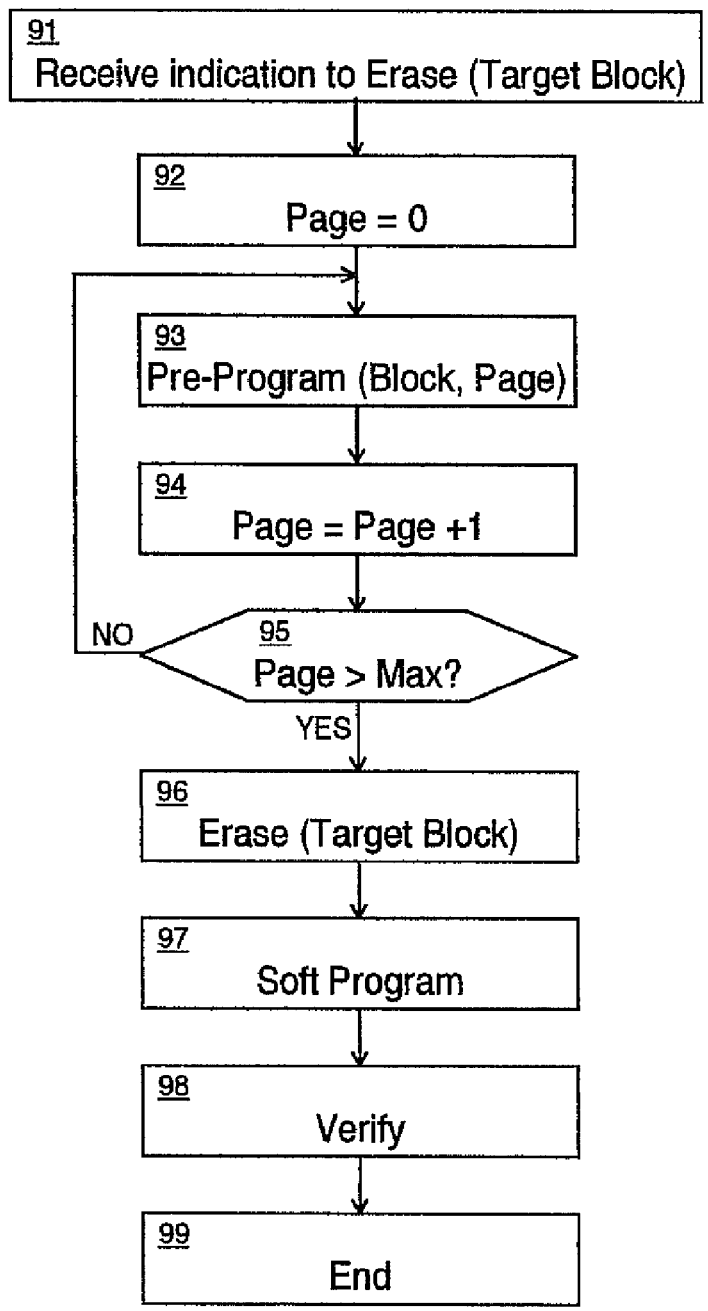
FIG. 1 is a flow chart of a conventional erase sequence.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

Figure 5:
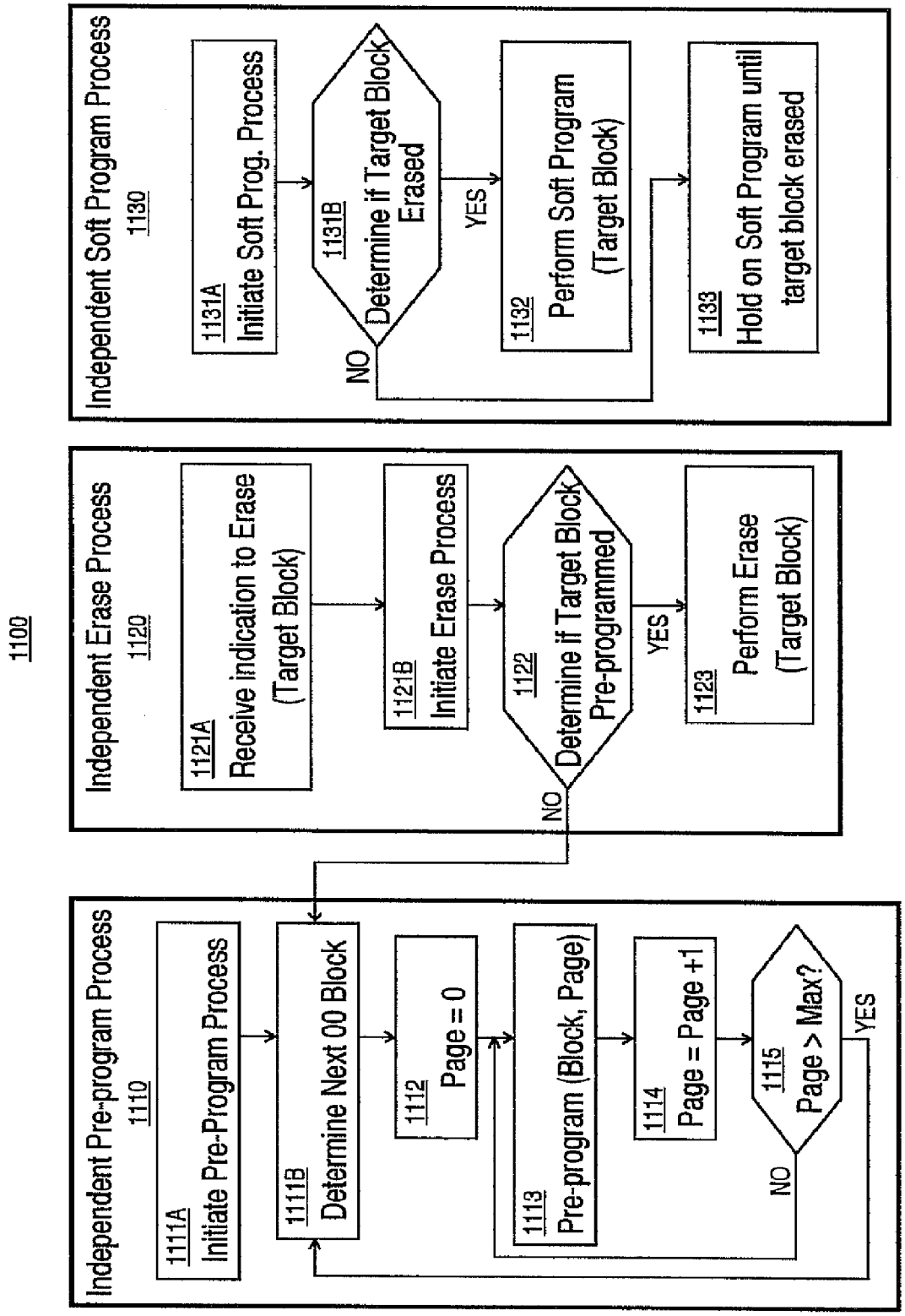
FIG. 5 is a flow chart of an exemplary fractured erase process in accordance with one embodiment of the present invention.

FIG. 5 is a flow chart of exemplary fractured erase process 1100 in accordance with one embodiment of the present invention. In fractured erase process 1100 the pre-program, erase and soft program processes can be initiated independently. For example, independent pre-program process 1101, independent erase process 1102 and independent soft program process 1103 can be initiated independently. The independent pre-programming process 1101 operations of 1110, 1120, 1130 and 1140 can be initiated and performed independently before the "actual" erasing operations of the independent erase process 1102 or soft program process 1103.

In one exemplary implementation, the independent pre-programming is initiated at operation 1111A. The independent pre-programming determining a block to pre-program in operation 1111B. The process can initiate or begin pre-processing independently by determining a block to begin pre-processing at without direction from an erase process (e.g., independent erase process 1120) or can also determine a block to begin pre-processing if an erase process indicates it needs a block pre-programmed. The process proceeds to establish a page 0 starting location in operation 1112 of the block and forwards a page indication to pre-program operation 1113. The page is pre-programmed in operation 1113 (e.g., drives a memory cell to a logic state opposite of a static state, etc.). When the page is pre-programmed the page indicator is incremented in operation 1114 and then compared against the maximum page count in operation 1115. If the indicated page is less than the maximum page count the process loops back to pre-programming the incremented page in operation 1113 and if the page is more than the maximum page count the process loops back to determine the next block in operation 1111. The independent pre-program process establishes the location of page 0 of the new block in operation 1112 and repeats the process. By independently performing the pre-program process several blocks can be pre-programmed in the "background" and ready when an indication to begin an actual erase begins. If a block or page designated for erase is not pre-programmed the independent pre-program process can react by determining (e.g., that is the next block to be pre-programmed The independent erase process 1120 receives an indication to erase in operation 1121A and the erase process is initiated in operation 1121B. While the independent erase process 1120 is initiated independent of the pre-program operation, the independent erase process does check to determine if a target block has already been pre-programmed in operation 1122. If the target block has been pre-programmed the actual erase operation 1123 (e.g., diving the memory cell to a static logic state, etc.) is performed independent of pre-programming operations currently proceeding in independent pre-program process 1110. Since the pre-programming can already be performed when the erase indication is received the latency of the overall erase operation is reduced. If the target block has not been pre-programmed the actual erase request can trigger an immediate pre-programming initiation of the target block in operation 1111 or can wait until the target block is pre-programmed in the normal course of the independent pre-programming process 1110.

The independent soft program process 1130 can be initiated in operation 1131A independently of pre-program or erase operations. While the independent soft program process 1130 is initiated independent of the pre-program operation and the erase operation the independent soft program process does check in operation 1131B to determine if a target block has already been erased. If the target block has been erased the soft programming operation 1132 (e.g., diving the memory cell to a static logic state, etc.) is performed independent of pre-programming operations or erase operations currently proceeding in independent pre-program process 1110 or independent erase process 1120. Since the pre-programming and erase can already be performed when the soft program process is initiated the latency of the overall erase is reduced. If the target block has not been pre-programmed or erased the soft programming operation is held in operation 1133 until the target block is erased by independent erase process 1120 in due course.

Figure 2A:
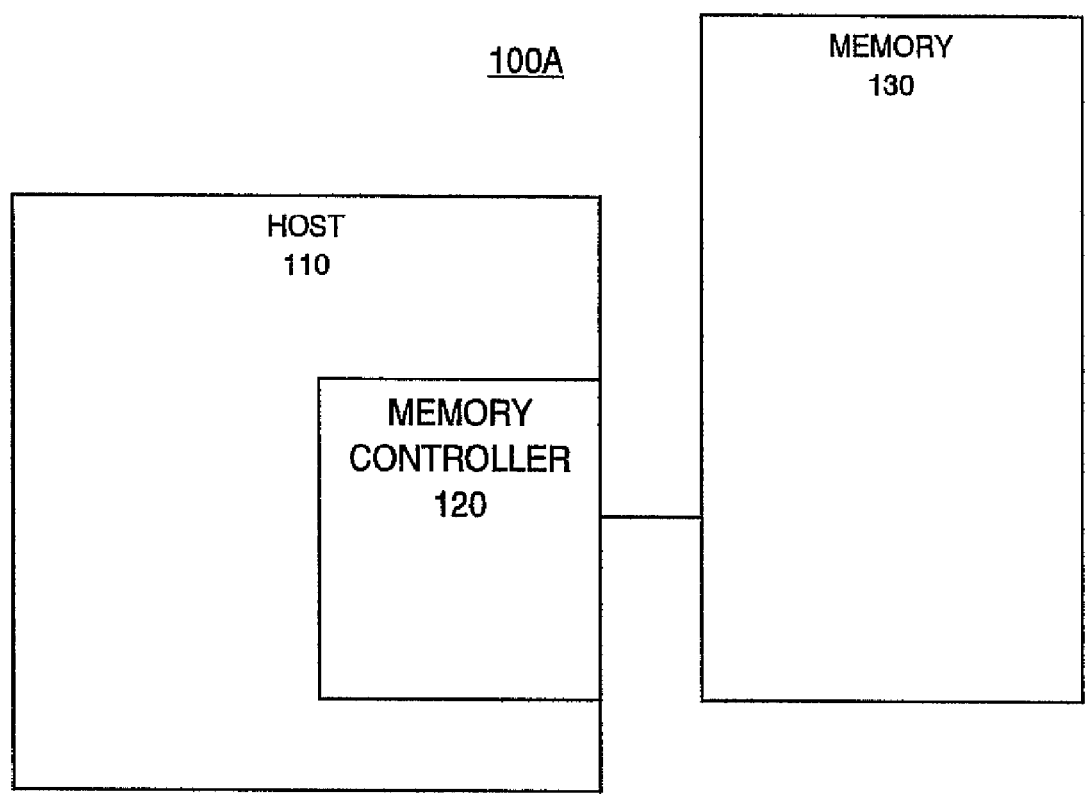
FIG. 2A is a block diagram of an exemplary memory system in accordance with one embodiment of the present invention.
Figure 2B:
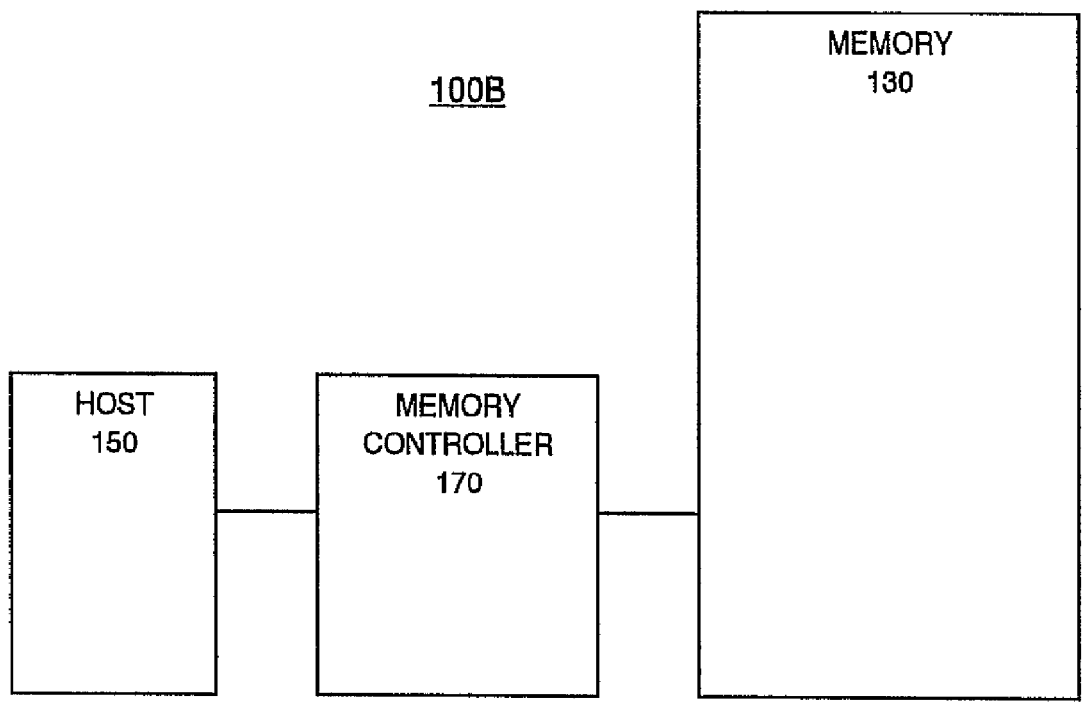
FIG. 2B is a block diagram of another exemplary memory system in accordance with one embodiment of the present invention.

FIG. 2A is a block diagram of a memory system 100A in accordance with one embodiment of the present invention. Memory system 100A includes host 110, memory controller 120, and memory 130. Host 110 is coupled to memory 130. It is appreciated that a variety of memory control components can be utilized to implement fractured erase process (e.g., fractured erase process 1000). For example, memory controller 120 can be integrated in the host 110 (e.g., integrated in a processor, etc,) as shown in FIG. 2A. It is also appreciated a memory controller can be implemented external to the host (e.g., a separate chip set memory controller, a memory controller integrated in a memory chip, a memory controller included in an external memory device, etc.). FIG. 2B is a block diagram of a memory system 100B in accordance with one embodiment of the present invention in which a memory controller can be implemented external to the host. Memory system 100B includes host 150 coupled to memory controller 170 which is coupled to memory 130. In order not to obfuscate the invention in numerous examples the following detailed description refers primarily to the example of memory system 100A and memory controller 120, however a variety of other memory control component implementations can perform similar fractured pre-programming operations.

The components of memory system 100A cooperatively operate to store information. Host 110 processes information. Memory controller 120 controls communication of the information between host 110 and memory130. Memory 130 stores the information for host 110. Memory logic 132 coordinates the operations within memory 130. In one embodiment the memory 130 is a NAND device. In one embodiment, storing information in memory system 100 involves writing and erasing information in memory 130. It is appreciated the present invention is readily adaptable to a variety of writing and erasing operations.

In one embodiment memory system 100A can also perform a fractured erase process. For example, memory controller 120 directs fractured pre-programming of portions of the memory 130. In one exemplary implementation, the fractured pre-programming includes driving a bit to a logical value opposite of a static state independent of an erase indication. Memory controller 120 can interrupt an erase sequence to perform a program operation and return to the erase operation at an appropriate time.

To assure a uniform erase state an independent pre-programming operation (e.g., independent pre-programming process 1110) is performed. In one embodiment, an independent pre-programming process programs or drives the bits in a static logical state to a non-static logical state (e.g., a logic state opposite of the static state) on a defined granularity basis. In one exemplary implementation, a pre-programming process programs the logical 1 bits to a 0 logical state in page by page manner within the target erase block. By having the bits in the target block "start off" in the programmed state, the erase operation is more likely to result in a uniform erase level regardless of whether the bits were previously in the logical 1 or the logical 0 state. In one embodiment, an independent pre-program is initiated before receiving a write direction (unlike a conventional or legacy device that waits for the write or erase indication before beginning pre-programming and/or the actual block erase operation). In some conventional devices this preprogramming operation becomes a substantial amount of the total time taken during an erase operation. In one embodiment, memory 130 is partitioned in to multiple blocks with each block containing a number of pages.

Figure 2C:
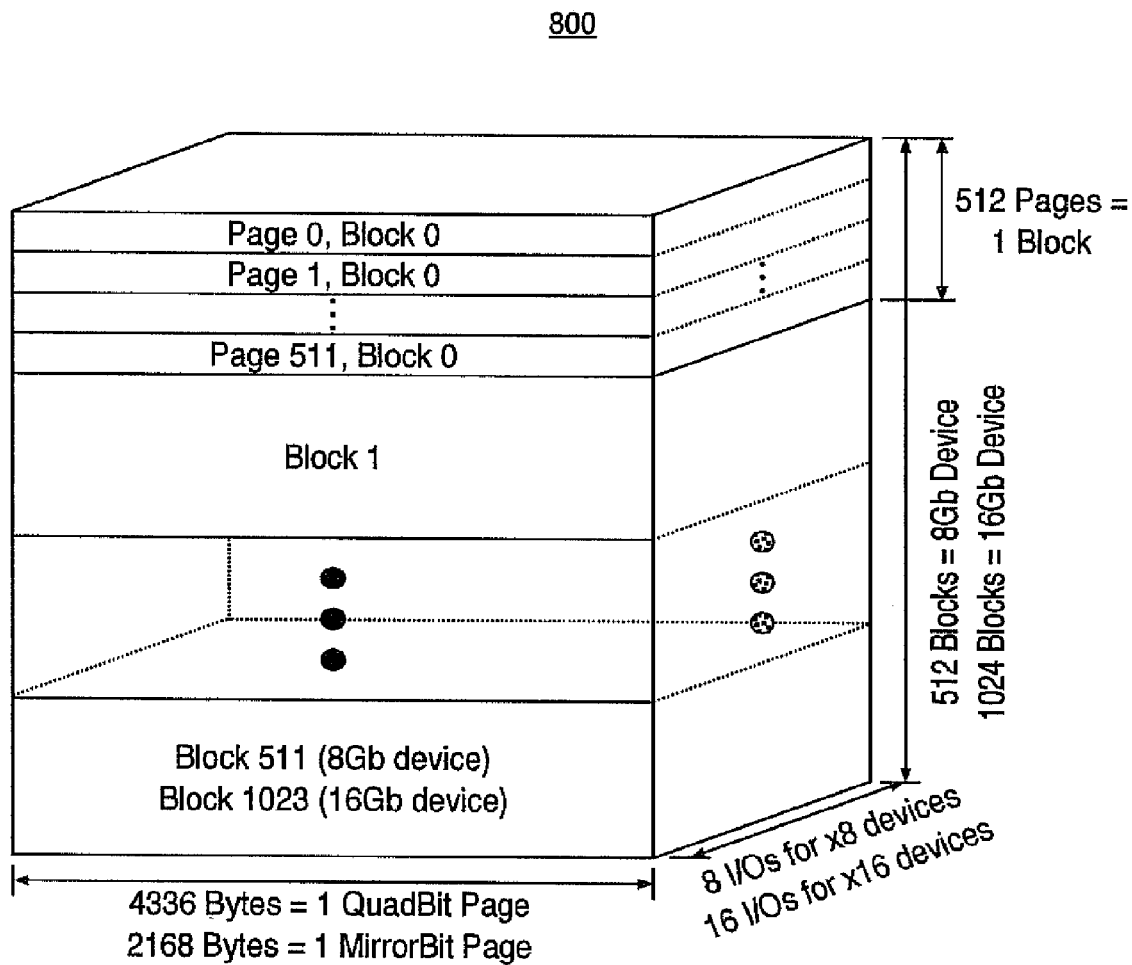
FIG. 2C is an exemplary block diagram of an exemplary memory architecture in accordance with one embodiment of the present invention.

In one embodiment, the fractured erase can be performed on different levels of granularity. For example, the fractured erase can be performed on a page by page basis or on an entire block. FIG. 2C is an exemplary block diagram of memory architecture 800 in accordance with one embodiment of the present invention. Memory architecture 800 can have a plurality of configurations. For example, the architecture can be implemented in an 8 Gb device with 512 blocks, 16 Gb device with 1024 blocks with 512 pages in each block, etc. Each page (or a portion of the page) can be operated on in a bit wise, word-wise or page wise basis. In one exemplary implementation, there is a static logical value that bits are set to initially. During program of a write operation the logical value of the bit can be changed to logical value opposite of the static logical value. In one exemplary implementation, a static logical value is a logical 1.

In one exemplary implementation, the fractured erase is performed by an on-chip sequencer. A direct correlation can be maintained between a programming or writing and host direction to write something.

In one embodiment, a memory controller tracks when portions of the memory are becoming full. For example, a memory controller checks the status of when pages in a block are not going to be used again and when they are going to be used again. The memory controller can determine if a block is becoming fragmented and can run a de-fragmentation operation. In one exemplary implementation, if intermittent portions of blocks (e.g., odd pages, every forth page, etc.) have valid data and some intermittent portions do not have valid data (e.g., even pages, pages other than every forth page, etc.) a defrag operation can be performed to better organize memory storage. For example, if a first block has odd pages with valid data and even with non-valid and a second block has even pages with valid data and odd pages with non-valid data, a defrag operation can be performed in which a determination is made if an empty third block that is already erased is available and the third block is available, the valid data from the odd pages in the first block and valid data from the even pages in the second block can be moved to the third block. When the valid data is moved the first block and second block can be erased using a fractured preprogramming operation. While the current examples are coincidentally described in symmetrical terms with regard to the valid data (e.g., every odd page, etc.) and invalid data (every even page, etc.) for convenience of explanation, it is appreciated the present invention is readily adaptable to a variety of both symmetrical and nonsymmetrical intermediate portions of valid data and intermediate portions of non valid data.

In one embodiment, an independent erase sequence can be interrupted unlike a conventional system where erase operations including the preprogramming are performed by a memory's internal state machine or logic and a host system is unable to break into this lengthy process to perform a read or program operations.

Figure 3:
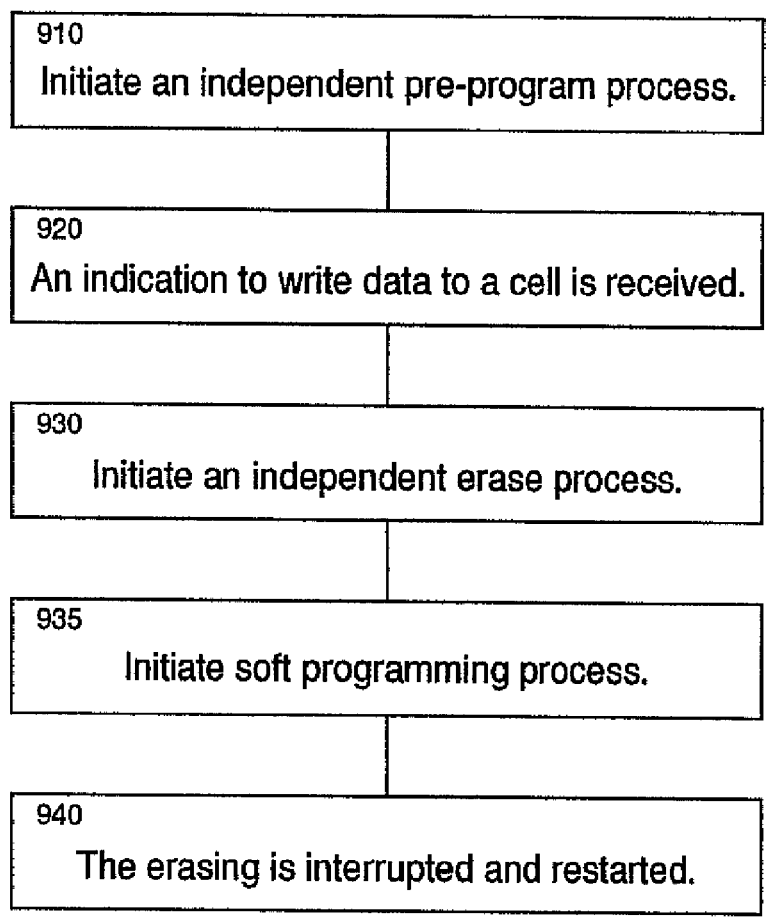
FIG. 3 is flow chart of an exemplary memory alteration process utilizing independent pre-programming in accordance with one embodiment of the present invention.

FIG. 3 is flow chart of exemplary memory alteration process 300 in accordance with one embodiment of the present invention. In one embodiment, memory alteration process 300 includes partitioning of an independent pre-program process, an independent erase process, and independent soft programming process. For example, memory alteration process 300 includes independent pre-programming.

At 910, an independent pre-program process is initiated. In one embodiment, the independent pre-program process is partitioned from erase commands. In one exemplary implementation the independent pre-program process is run in the background. In one embodiment, the independent pre-programming is performed by a memory control component (e.g., a memory controller integrated in a host, a memory controller external to a host, etc.). The pre-preprogramming can initiate a programming of target storage bits to a static state.

At 920, an indication to write data to a cell is received. It is appreciated that the indication can be to write a group of cells. In one embodiment, the indication to write data is received by a host. In one exemplary implementation, a memory control component determines a row address of a physical block address associated with the data. When determining the physical block address, the memory control component can also calculate both the target row and column address in the memory. A starting column address for a region including a plurality of physical block addresses can be specified by the two least significant bits of the logical block address from a host, permitting the column address to be calculated directly.

At 930, an independent erase process is initiated. A determination is made if a target cell is already pre-programmed. In one embodiment, the pre-programming is already performed on the cell and the cell is ready to be erased without having to wait for pre-programming. It is appreciated that a group or plurality of cells can be erased. In one embodiment, erasing a cell brings the cell to a static state or predetermined logical state, (e.g., a logical 1, etc.). In one embodiment, a plurality of cells are erased together (e.g., a page of cells, sector of cells, a block of cells, etc.).

At 935, soft programming process is initiated. In one embodiment, the soft programming process compensates for "over" erase bits or effects. The soft programming process can also facilitate better erase distribution across columns and rows of memory cells.

Optionally at 940, the erasing is interrupted and restarted. The erasing can be interrupted by an operation other than an erase, a read or a program operation. The erasing sequence can be restarted at an appropriate time (e.g., when the read or program operation is complete).

FIG. 4 is a block diagram of independent pre-programming process 400 in accordance with one embodiment of the present invention. In one embodiment, the host system is responsible for individually pre-programming the pages within a block before performing an erase operation. In one exemplary implementation, the sequence can be interrupted at any time while the host is in control.

At 1010, a determination is made if portions of memory are associated with invalid data (e.g., no longer relevant, etc.).

A command to perform independent pre-programming is issued at 1020. In one embodiment, a memory control component recognizes when a portion of a memory has invalid data and issues a command to initiate the independent pre-programming. It is appreciated that a variety of memory control component implementations can be utilized (e.g., integrated in a host, external to a host, etc.). In one exemplary implementation, the pre-program command is associated with conditioning a page in a target block.

At 1030, an independent pre-programming operation is performed in accordance with the pre-program command. In one embodiment, the independent preprogramming operation conditions portions of the memory associated with invalid data for an erase operation. In one exemplary implementation, the pre-programming drives a memory cell bit to a logical value opposite of a static state. It is appreciated the independent pre-programming can be performed on various levels of granularity. For example, independent pre-programming can be performed on a page by page basis, sector basis, block basis, etc. In one embodiment, the independent pre-programming is performed before receipt of an erase indication (e.g., in the background, whenever stored data is determined to be invalid, etc.).

Thus, the present invention facilitates efficient and effective information storage. The present invention also facilitates fractured erase operations to be partitioned and initiated independently. In one exemplary implementation, independent pre-programming operations are run in the background to avoid consuming a substantial amount of time delay that would otherwise be consumed performing pre-programming operation at the time an erase command is issued. In addition, the erase sequence can be interrupted and restarted facilitating the minimization of latency from a host perspective when a read or program operation is pending.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory alteration process comprising:
determining if portions of a memory are associated with invalid data; and
performing independent pre-programming on portions of the memory associated with the invalid data in which the independent pre-programming is performed before receipt of an erase indication on a cell previously used to store data.

2. A memory alteration process of claim 1 wherein a memory controller directs the independent pre-programming.

3. A memory alteration process of claim 1 the independent pre-programming comprises:
determining a next block:
setting a page indication to a start page of the block;
pre-programming the page;
incrementing the page indication; and
determining if the page indication indicates the block is pre-programmed.

4. A memory alteration process of claim 1 wherein a memory controller recognizes when the portions of the memory have invalid data and initiates the independent pre-programming.

5. A memory alteration process of claim 2 wherein the independent preprogramming includes driving a memory cell bit to a logical value opposite of a static state.

6. A memory alteration process of claim 3 the independent pre-programming is performed on various levels of granularity.

7. A memory alteration process of claim 1 further comprising performing an independent erase process, including issuing an erase command that initiates a programming of target storage bits to a static state.

8. A memory alteration process of claim 1 further comprising performing an independent soft programming process if a target block has already been erased.

9. A memory system comprising:
a memory for storing information; and
a memory control component that directs a fractured erase process in which pre-programming is performed on portions of said memory previously used to store information that are invalid without the necessity of an erase indication.

10. A memory system of claim 9 in which the fractured erase is performed on a page by page basis.

11. A memory system of claim 9 in which the fractured erase is performed on an entire block.

12. A memory system of claim 9 further comprising an on-chip sequencer that performs said fractured erase.

13. A memory system of claim 9 in which said fractured erase process is interrupted with an operation other than an erase and the fractured erase process is subsequently restarted.

14. A memory system of claim 9 in which said fractured erase process is interrupted with a program operation and the fractured erase process is subsequently restarted.

15. A memory system comprising:
a memory for storing information;
a memory control component that controls communication of the information to the memory and directs a fractured erase process in which pre-programming is performed independent of an erase indication on a portion of said memory previously used to store information, including:
determining if the portion is associated with invalid data;
performing a defragmentation operation if the portion is associated with invalid data; and
performing independent pre-programming on the portion before receipt of an erase indication.

16. A memory system of claim 15 wherein a first block of the memory includes pages with valid data and pages that includes the invalid data and a defrag operation includes determining if an empty third block that is already erased is available and if the third block is available, the valid data from the pages in the first block are moved to the third block.

17. A memory system of claim 16 in which the valid data is moved after the first block is erased using a fractured preprogramming operation.

18. A memory system of claim 15 the independent pre-programming can be performed on various levels of granularity.

19. A memory system of claim 15 further comprising performing an independent erase process, including issuing an erase command that initiates a programming of target storage bits to a static state.

20. A memory system of claim 15 in which said preprogramming is interrupted with a program operation and is subsequently restarted.

* * * * *